(12) United States Patent
Liu et al.

(10) Patent No.: US 11,380,749 B2
(45) Date of Patent: Jul. 5, 2022

(54) DISPLAY PANEL, DRIVING METHOD THEREOF, AND DISPLAY APPARATUS

(71) Applicant: BOE Technology Group Co., Ltd., Beijing (CN)

(72) Inventors: Yingming Liu, Beijing (CN); Xue Dong, Beijing (CN); Haisheng Wang, Beijing (CN); Xiaoliang Ding, Beijing (CN); Changfeng Li, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 573 days.

(21) Appl. No.: 16/344,923

(22) PCT Filed: Nov. 2, 2018

(86) PCT No.: PCT/CN2018/113656
§ 371 (c)(1),
(2) Date: Apr. 25, 2019

(87) PCT Pub. No.: WO2019/085989
PCT Pub. Date: May 9, 2019

(65) Prior Publication Data
US 2021/0343819 A1    Nov. 4, 2021

(30) Foreign Application Priority Data

Nov. 3, 2017  (CN) .......................... 201711068856.2
Nov. 3, 2017  (CN) .......................... 201711069984.9

(51) Int. Cl.
*G06F 3/038*   (2013.01)
*H01L 27/32*   (2006.01)
*G09G 3/3258*  (2016.01)

(52) U.S. Cl.
CPC ....... *H01L 27/3269* (2013.01); *G09G 3/3258* (2013.01); *H01L 27/3272* (2013.01);
(Continued)

(58) Field of Classification Search
USPC .................... 345/174, 207, 77, 206; 427/68; 359/290; 257/292
See application file for complete search history.

(56) References Cited

U.S. PATENT DOCUMENTS 9,595,239 B2 *  3/2017  Drolet ....................... G02F 1/29
2005/0225519 A1 * 10/2005 Naugler ............... G09G 3/3291
345/77

(Continued)

FOREIGN PATENT DOCUMENTS

CN       1734541 A    2/2006
CN     101221307 A    7/2008
(Continued)

OTHER PUBLICATIONS

International Search Report dated Feb. 1, 2019, issued in counterpart Application No. PCT/CN2018/113656 (11 pages).
(Continued)

*Primary Examiner* — Thuy N Pardo
(74) *Attorney, Agent, or Firm* — WHDA, LLP

(57) ABSTRACT

A display panel which may include a plurality of sub-pixel units (1) and a plurality of photosensitive detection units (2) corresponding to the plurality of sub-pixel units (1) respectively. Each of the plurality of the photosensitive detection units (2) may include at least two photosensitive sensors (21).

18 Claims, 9 Drawing Sheets

(52) U.S. Cl.
    CPC ............... *G09G 2320/0295* (2013.01); *G09G 2320/045* (2013.01); *G09G 2320/0693* (2013.01); *G09G 2360/148* (2013.01)

(56) References Cited

U.S. PATENT DOCUMENTS

| | | | |
|---|---|---|---|
| 2005/0248515 A1* | 11/2005 | Naugler | G09G 3/3233 345/77 |
| 2006/0012311 A1 | 1/2006 | Ogawa | |
| 2010/0039370 A1* | 2/2010 | Miles | G02B 27/017 427/68 |
| 2010/0309540 A1* | 12/2010 | Miles | G09G 3/2074 359/290 |
| 2010/0315377 A1 | 12/2010 | Chang et al. | |
| 2011/0080632 A1* | 4/2011 | Miles | G02B 27/01 359/290 |
| 2011/0096047 A1 | 4/2011 | Endo | |
| 2011/0102365 A1* | 5/2011 | Park | G06F 3/0412 345/174 |
| 2014/0320553 A1 | 10/2014 | Eom et al. | |
| 2016/0232875 A1* | 8/2016 | Drolet | G09G 3/2003 |
| 2017/0078513 A1* | 3/2017 | Chang | G06F 3/0304 |
| 2017/0337413 A1* | 11/2017 | Bhat | G06K 9/00087 |
| 2018/0060641 A1* | 3/2018 | Kim | G06K 9/00013 |
| 2018/0240405 A1 | 8/2018 | Li et al. | |
| 2018/0267651 A1* | 9/2018 | Park | G06F 3/0412 |
| 2018/0336822 A1 | 11/2018 | Van et al. | |
| 2019/0149687 A1* | 5/2019 | Chang | H01L 27/14607 257/292 |
| 2020/0274929 A1* | 8/2020 | Binder | H04L 67/12 |
| 2020/0294401 A1* | 9/2020 | Kerecsen | G05D 1/0287 |
| 2020/0342194 A1* | 10/2020 | Bhat | A61B 5/1172 |
| 2021/0075861 A1* | 3/2021 | Binder | H04L 67/12 |

FOREIGN PATENT DOCUMENTS

| | | |
|---|---|---|
| CN | 101900899 A | 12/2010 |
| CN | 101964353 A | 2/2011 |
| CN | 103033262 A | 4/2013 |
| CN | 106531081 A | 3/2017 |
| CN | 106887212 A | 6/2017 |
| CN | 106935190 A | 7/2017 |
| CN | 107785406 A | 3/2018 |
| GN | 107731880 A | 2/2018 |

OTHER PUBLICATIONS

Office Action dated Aug. 14, 2019, issued in counterpart CN Application No. 201711069984.9, with English translation (9 pages).
Office Action dated Sep. 26, 2019, issued in counterpart CN Application No. 201711068856.2, with English Translation. (15 pages).

* cited by examiner

Prior Art

Prior Art

DISPLAY PANEL, DRIVING METHOD THEREOF, AND DISPLAY APPARATUS

CROSS-REFERENCE TO RELATED APPLICATIONS

This application claims benefits of the filing dates of Chinese Patent Application No. 201711069984.9 filed on Nov. 3, 2017, and Chinese Patent Application No. 201711068856.2 filed on Nov. 3, 2017, the disclosures of which are hereby incorporated in its entirety by reference.

TECHNICAL FIELD

This disclosure relates to a display technology, in particular, to an organic light-emitting diode (OLED) display panel, a driving method thereof, and a display apparatus.

BACKGROUND

At present, since organic light-emitting diode (OLED) display panels use oxide thin film transistors (TFT), whose characteristics are relatively unstable; threshold voltage Vth, mobility MOB, and some other parameters of the thin film transistors can drift and change as time of usage increases. As such, it is difficult to achieve an expected value of current under a standard input voltage. Therefore, an image of a desired gray-scale cannot be consistently realized so that the display pixels generate inconsistent brightness, thereby causing abnormal image display. In order to obtain a normal image display, electrical compensation is usually carried out for the TFTs. Although influence of the Vth and the MOB can be reduced through external circuit compensation, the light-emitting material EL in the OLED apparatus can age. The external circuit compensation can only compensate characteristics of the thin film transistors, but cannot solve the problems due to the aging of the light-emitting material (EL) and the like.

BRIEF SUMMARY

Accordingly, one example of the present disclosure is a display panel. The display panel may include a plurality of sub-pixel units and a plurality of photosensitive detection units corresponding to the plurality of sub-pixel units respectively. One of the plurality of the photosensitive detection units may include at least two photosensitive sensors. Photosensitivity of each of the at least two photosensitive sensors in a same photosensitive detection unit may be different from one another. A light receiving area of each of the at least two photosensitive sensors in the same photosensitive detection unit may be different from one another.

In one embodiment, an area of a photosensitive surface of each of the at least two photosensitive sensors in the same photosensitive detection unit is different from one another, and the area of the photosensitive surface is the light receiving area.

In one embodiment, an area of a photosensitive surface of each of the at least two photosensitive sensors in the same photosensitive detection unit is the same, and at least one of photosensitive surfaces of the at least two photosensitive sensors in the same photosensitive detection unit is provided with a shielding layer.

At least two of the photosensitive surfaces of the at least two photosensitive sensors in the same photosensitive detection unit may be provided with shielding layers respectively, each of the shielding layers may have an opening region of a different size, and an area of the opening region may be the light receiving area. Each of the shielding layers may be a metal layer or a black matrix. The shielding layers and the photosensitive surfaces of the photosensitive sensors may be in contact with each other.

The plurality of photosensitive detection units may be located between adjacent columns of the sub-pixel units. Distances between each of the photosensitive sensors in the same photosensitive detection unit and an adjacent sub-pixel unit corresponding to the photosensitive detection unit may be different. The photosensitive detection units may be located between adjacent rows of the sub-pixel units. The at least two photosensitive sensors in a photosensitive detection unit may be located on two sides of a sub-pixel unit corresponding to the photosensitive detection unit respectively. Two adjacent photosensitive detection units in a same column may share some of the at least two photosensitive sensors.

The photosensitive detection units may be in one-to-one correspondence with the sub-pixel units. One of the plurality of the photosensitive detection units may include three photosensitive sensors.

Another example of the present disclosure is a display apparatus comprising the display panel according to one embodiment of the present disclosure.

Another example of the present disclosure is a driving method of the display panel according to one embodiment of the present disclosure. The driving method may include acquiring electric signals outputted by the at least two photosensitive sensors in a photosensitive detection unit corresponding to a sub-pixel unit, determining an actual value of brightness of light emitted by the sub-pixel unit based on photosensitivity of the at least two photosensitive sensors in the photosensitive detection unit and the electric signals outputted by the photosensitive sensors, and adjusting a driving voltage of the sub-pixel unit based on the determined actual value of brightness of light emitted by the sub-pixel unit and a calibration value of brightness of the sub-pixel unit.

Determining the actual value of brightness of light emitted by the sub-pixel unit based on photosensitivity of the at least two photosensitive sensors in the photosensitive detection unit and the electric signals outputted by the photosensitive sensors may include determining the photosensitive sensors outputting unsaturated electric signals and determining the actual value of brightness of light emitted by the sub-pixel unit based on an electric signal of a photosensitive sensor with the highest photosensitivity among the photosensitive sensors outputting the unsaturated electric signals.

Adjusting the driving voltage of the sub-pixel unit based on the determined actual value of brightness of light emitted by the sub-pixel unit and the calibration value of brightness of the sub-pixel unit may include adjusting the driving voltage of the sub-pixel unit lower if the actual value of brightness of light emitted by the sub-pixel unit is larger than the calibration value of brightness, adjusting the driving voltage of the sub-pixel unit higher if the actual value of brightness of light emitted by the sub-pixel unit is smaller than the calibration value of brightness, and maintaining the driving voltage of the sub-pixel unit if the actual value of brightness of light emitted by the sub-pixel unit is equal to the calibration value of brightness.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
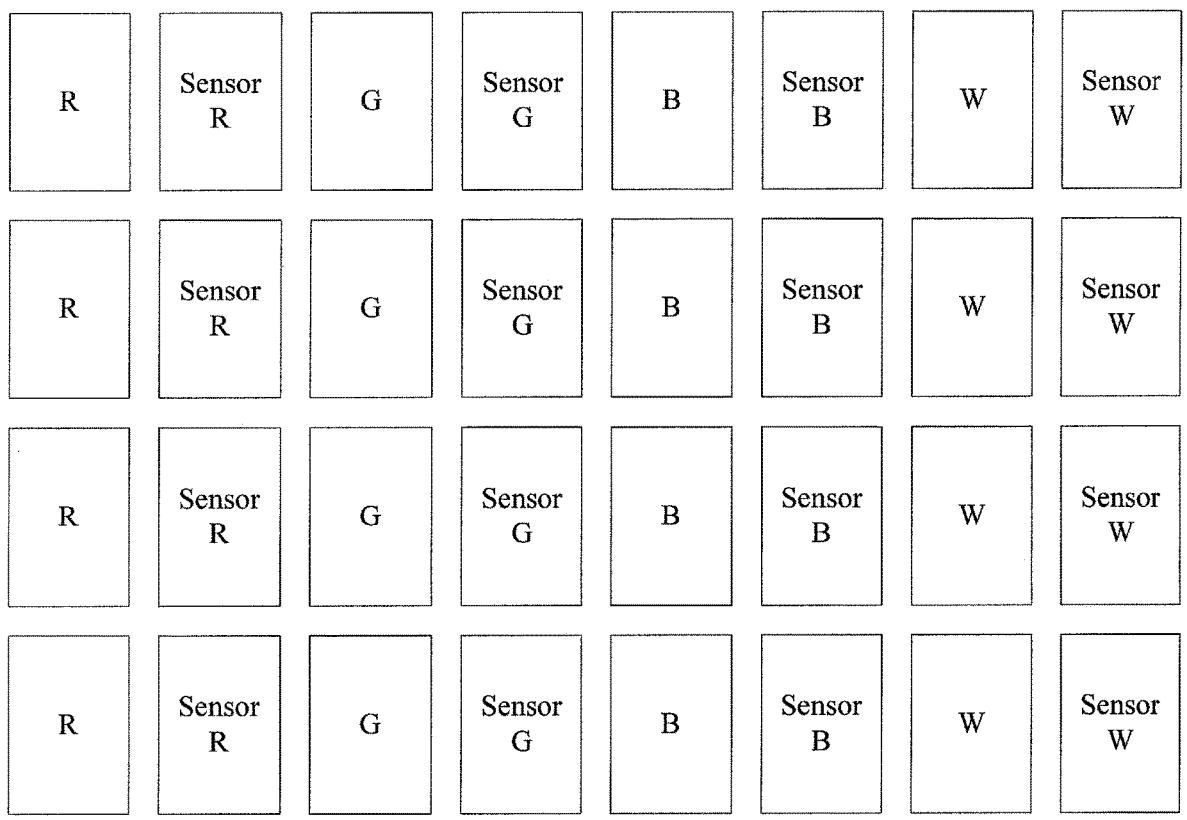
FIG. 1 is a schematic diagram of an OLED display panel in the prior art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals. The described embodiments are part of the embodiments of the present disclosure, but are not all embodiments. According to the embodiments of the present disclosure, all other embodiments obtained by persons of ordinary skill in the art without creative efforts, belong to the protective scope of the disclosure.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

FIG. 1 is a schematic diagram of an OLED display panel in the prior art. As shown in FIG. 1, photosensitive sensors R, G, B or W are placed on the periphery of each of the sub-pixel units red R, green G, blue B and white W. For example, a photosensitive TFT component can be adapted to monitor each of the sub-pixel units R, G, B and W in real time, so that adjustment can be made in real time.

Therefore, first, each of the photosensitive sensors R, G, B and W needs to be calibrated with a standard gamma curve of the sub-pixel units R, G, B, and W respectively. The gamma curve is a curve of brightness value vs. gray scale. A photocurrent detected by each of the corresponding photosensitive sensors R, G, B, or W has a one-to-one correspondence with a value of brightness, and the value of brightness can be obtained when the photocurrent is obtained. Thus, a calibration value of brightness A of each of the photosensitive sensors R, G, B and W is obtained. Each photosensitive sensor has a calibration value of brightness A corresponding to each of the gray scales in a range of 0 to 255.

Figure 2:
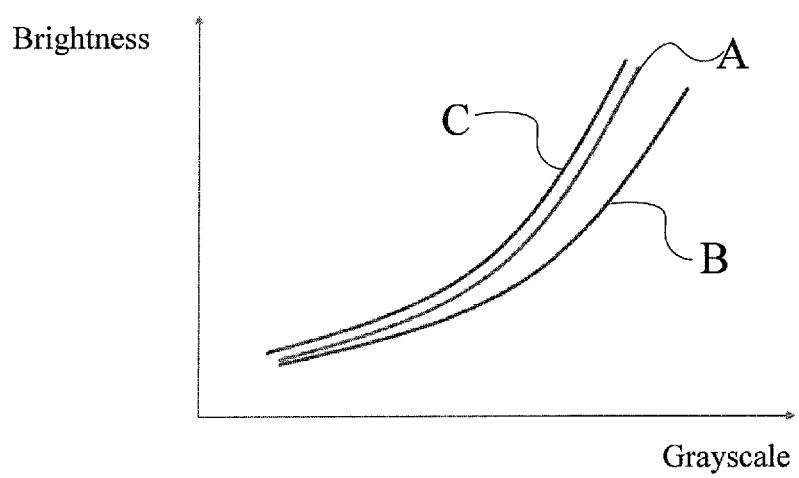
FIG. 2 is a graph of a relationship between brightness and grayscale in the prior art.

Then, the brightness of the sub-pixel unit is monitored through the photosensitive sensors. As shown in FIG. 2, an actual value of brightness B or C of the sub-pixel unit is obtained. Based on the relationship between the actual value of brightness B or C and the calibration value of brightness A, one can determine whether the brightness of the sub-pixel unit meets requirement or not. If the requirement is met, the driving voltage of the sub-pixel unit does not need to be adjusted. If the actual value of brightness of the sub-pixel unit is deviated, for example, the actual values of brightness C is larger than the calibration value of brightness A, then the driving voltage of the sub-pixel is adjusted lower. Then, the photosensitive sensor monitors the brightness of the sub-pixel unit again. After the photocurrent is obtained, the actual value of the brightness is compared with the calibration value of the brightness again. The above procedures are repeated and the adjustment is repeatedly made so that the actual value of brightness and the calibration value of brightness become closer and closer as time of usage increases, thereby maintaining normal display of images.

Figure 3:
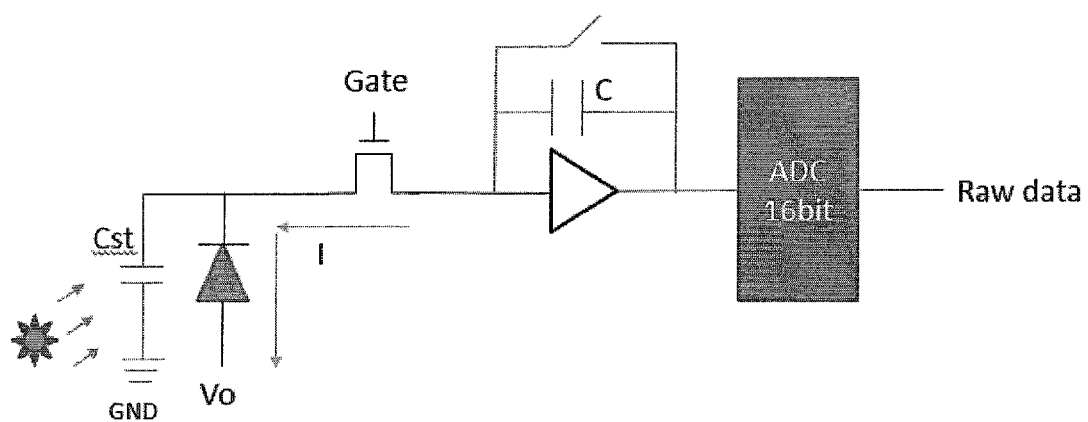
FIG. 3 is a schematic diagram of a photosensitive detection unit in the prior art.

FIG. 3 is a schematic diagram of a photosensitive detection unit in the prior art. As shown in FIG. 3, one terminal of the photosensitive sensor is coupled with a fixed potential Vo. Vo generally provides a voltage of −5V-0. It is used for controlling the reverse bias state of the photosensitive sensor. After the light irradiates the photosensitive sensor for a certain period of time, the photosensitive sensor generates photoelectrical charges. When a scanning line Gate is turned on, the photoelectrical charges generated by the photosensitive sensor are transferred to a capacitor C of the integrating circuit and converted into a voltage signal. Then, after passing an analog-to-digital converter (ADC), the voltage signal is outputted to a reading signal line Raw Data. Different values of photocurrent are generated under different intensity of irradiating light within a unit of time. The larger the intensity of irradiating is, the larger the photocurrent is. The storage capacitor Cst which is coupled with the photosensitive sensor generally has a capacitance value with a fixed storage capacity. For brightness of a small gray scale, the storage capacitor Cst does not reach the upper limit of the storage capacity. For the brightness of a large gray scale, the storage capacitor Cst easily reaches saturation of storage capacity. After the saturation is reached, when the scanning line Gate is turned on, a fixed quantity of the photoelectrical charges is outputted by the photosensitive sensor to the capacitor C of the integrating circuit.

In addition, values of brightness corresponding to the low gray scale and the high gray scale respectively are different. The higher the gray scale is, the larger the value of brightness is, the larger the photocurrent generated by the photosensitive sensor. As such, there is a following problem: the light is weak under a low grayscale. Thus, it usually takes a certain time of accumulation under irradiation for the photosensitive sensor to detect a certain value of photocurrent. When a certain time such as 100 milliseconds is accumulated, the detection circuit at the back can read the value of photocurrent. As such, the weak light under the low grayscale can be read. However, when the integral time is fixed, as the gray scale increases, the value of photocurrent gets larger so that the storage capacitance of the photosensitive sensor is saturated. As such, when a critical gray scale is reached, and when the gray scale is larger than the critical gray scale, a saturated value of photocurrent is obtained. As such, the brightness cannot be distinguished at high gray scales by the photosensitive sensors, therefore resulting in failure of modulation of the high gray scales.

An OLED display panel, a driving method thereof, and a display apparatus are provided according to embodiments of the present disclosure. The shape and the size of each component in the figures do not reflect its real proportion, and the purpose is merely illustrative of the content of the present disclosure.

Figure 4:
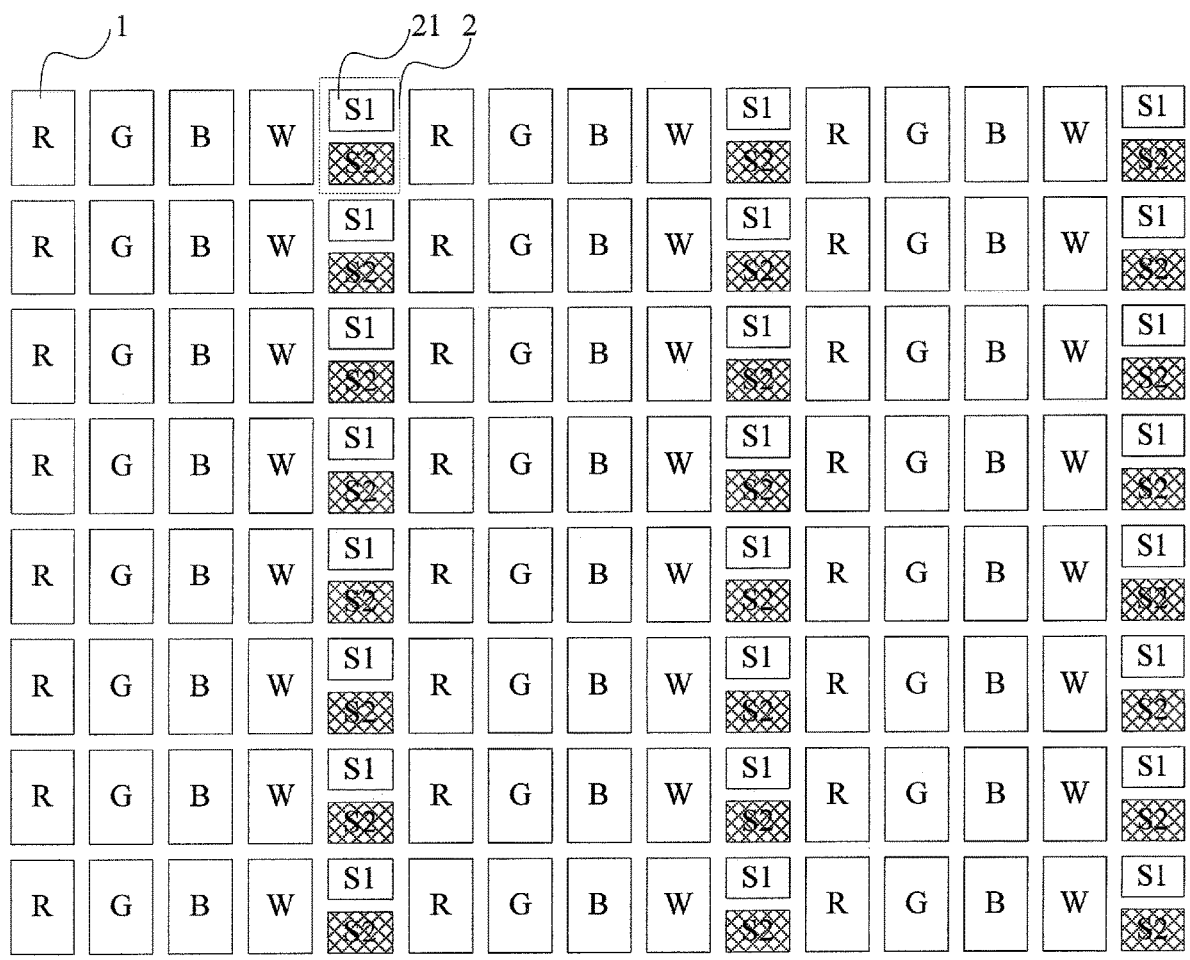
FIG. 4 is a schematic diagram of an OLED display panel according to an embodiment of the present disclosure.

FIG. 4 is a schematic structural diagram of an OLED display panel according to one embodiment of the present disclosure. As shown in FIG. 4, the OLED display panel includes a plurality of sub-pixel units 1, and a plurality of photosensitive detection units 2 corresponding to the sub-pixel units 1 respectively.

At least one of the plurality of the photosensitive detection units 2 comprises at least two photosensitive sensors 21. In one embodiment, each of the plurality of the photosensitive detection units 2 comprises at least two photosensitive sensors 21. The photosensitivities of the at least two photosensitive sensors 21, which are distinguished by different filling patterns in FIG. 4, in the same photosensitive detection unit 2 differ from one another.

In some embodiments, in the OLED display panel, the photosensitive sensor 21 adopts a photosensitive TFT component or a photosensitive PIN component to achieve the function, and it is not limited herein. FIG. 4 shows a scenario that each of the plurality of the photosensitive detection units 2 includes two photosensitive sensors 21 with different photosensitivity. During actual operation, it is also possible that the photosensitivities of the two photosensitive sensors 21 in the same photosensitive detection unit 2 are the same. It is not limited herein.

In some embodiments, in the OLED display panel, the photosensitivity of each of the photosensitive sensors 21 differs from one another means that each of the photosensitive sensors 21 can receive different degrees of light intensity in one unit of time. In some embodiments, the greater the degree of light intensity received by the photosensitive sensor 21 in one unit of time, the greater the photosensitivity is. Alternatively, the more light accumulated by the photosensitive sensor 21 in one unit of time, the faster the speed of the accumulation of the light, and the larger the photosensitivity is. That is, the shorter the time of light accumulation required to reach a certain value of photocurrent to be detected by the photosensitive sensor 21 is, the larger the photosensitivity is.

In some embodiments, in the OLED display panel, the photosensitive sensors 21 having different degrees of photosensitivity correspond to different ranges of gray scale respectively. The value of brightness in different ranges of the gray scale can be detected by the photosensitive sensors with different photosensitivities. The photosensitive sensors 21 corresponding to the lower range of gray scales have higher degrees of photosensitivity. For example, gray scales of 0-255 can be divided into two ranges, namely a low grayscale range and a high grayscale range. The low greyscale range is a range of 0-125, corresponding to the photosensitive sensors having a high degree of photosensitivity. The high greyscale range is range of 126-255, corresponding to the photosensitive sensors having low degree of photosensitivity. Under the same condition, it is easier for an electric signal outputted by the photosensitive sensor 21 corresponding to the lower range of the gray scales to saturate the connected storage capacitor Cst. It is more difficult for an electric signal outputted by the photosensitive sensor 21 corresponding to the higher range of the gray scales to saturate the connected storage capacitor Cst. As such, when the irradiation is accumulated for a short period of time, the photosensitive sensor 21 having a high degree of photosensitivity reads weak light of the low gray scale. Furthermore, the photosensitive sensor 21 corresponding to the high gray scale range is not saturated when the irradiation is accumulated for a long period of time.

Therefore, when detecting the brightness of the sub-pixel unit 1, the actual value of brightness of light emitted by sub-pixel unit 1 is determined based on the degree of photosensitivity of each of the photosensitive sensors 21 in the photosensitive detection unit 2 and the electric signals outputted by the photosensitive sensors 21. In some embodiments, first, which grayscale range that the actual value of brightness of light emitted by the sub-pixel unit 1 belongs to is determined based on whether the electric signals outputted by the photosensitive sensors 21 are saturated or not. An electrical signal of a proper photosensitive sensor 21 is used to determine the actual value of brightness of light emitted by the sub-pixel unit 1. Then, according to the determined actual value of the brightness of light emitted by the sub-pixel unit 1 and a preset calibration value of brightness, the driving voltage of the sub-pixel unit 1 is adjusted. Thereby, the brightness of the sub-pixel unit 1 can be distinguished by using different photosensitive sensors having different degrees of photosensitivity corresponding to different gray scales, thereby guaranteeing accuracy of adjustment of the displayed image by the photosensitive sensors 21.

In some embodiments, in the OLED display panel, the photosensitivity of the photosensitive sensors 21 can be adjusted in a plurality of ways which are introduced as follows.

Figure 5:
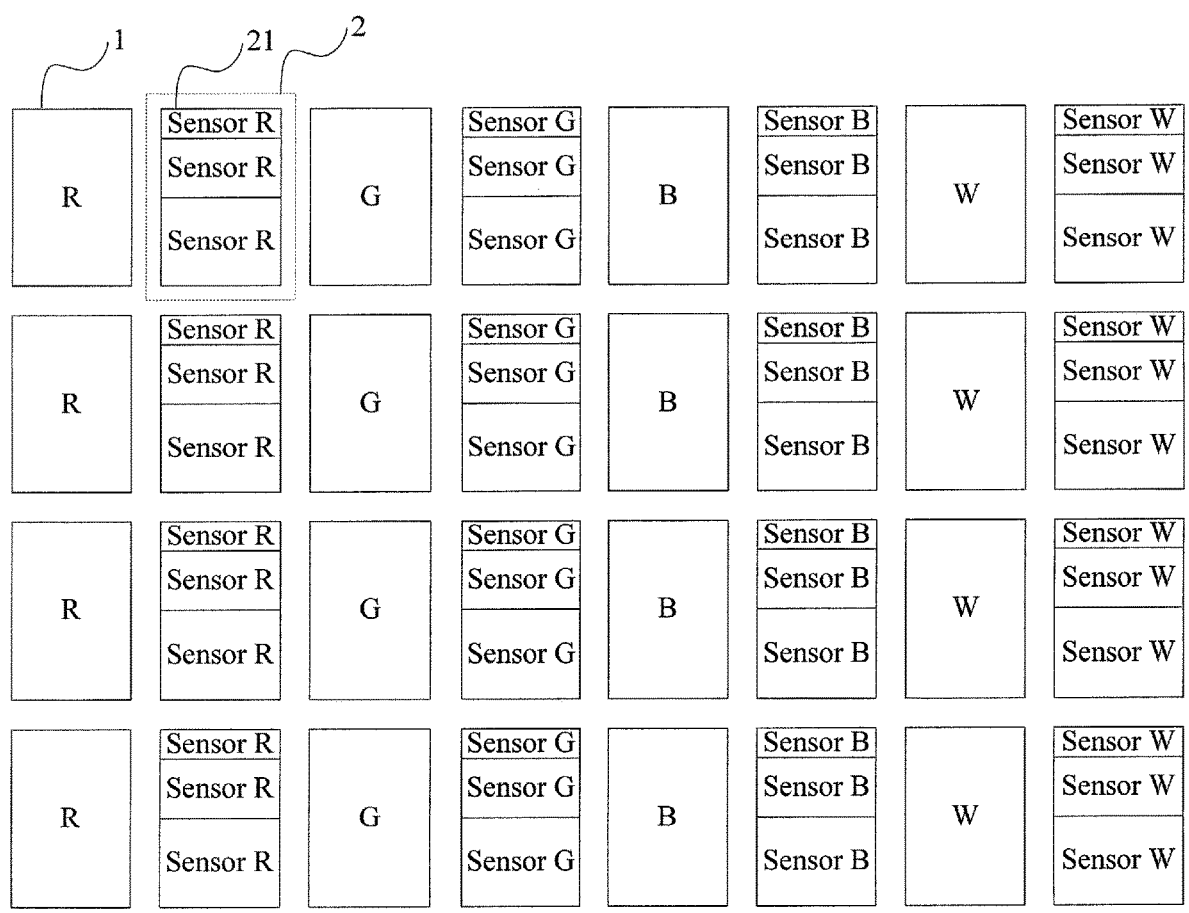
FIG. 5 is a schematic diagram of an OLED display panel according to an embodiment of the present disclosure.
Figure 6:
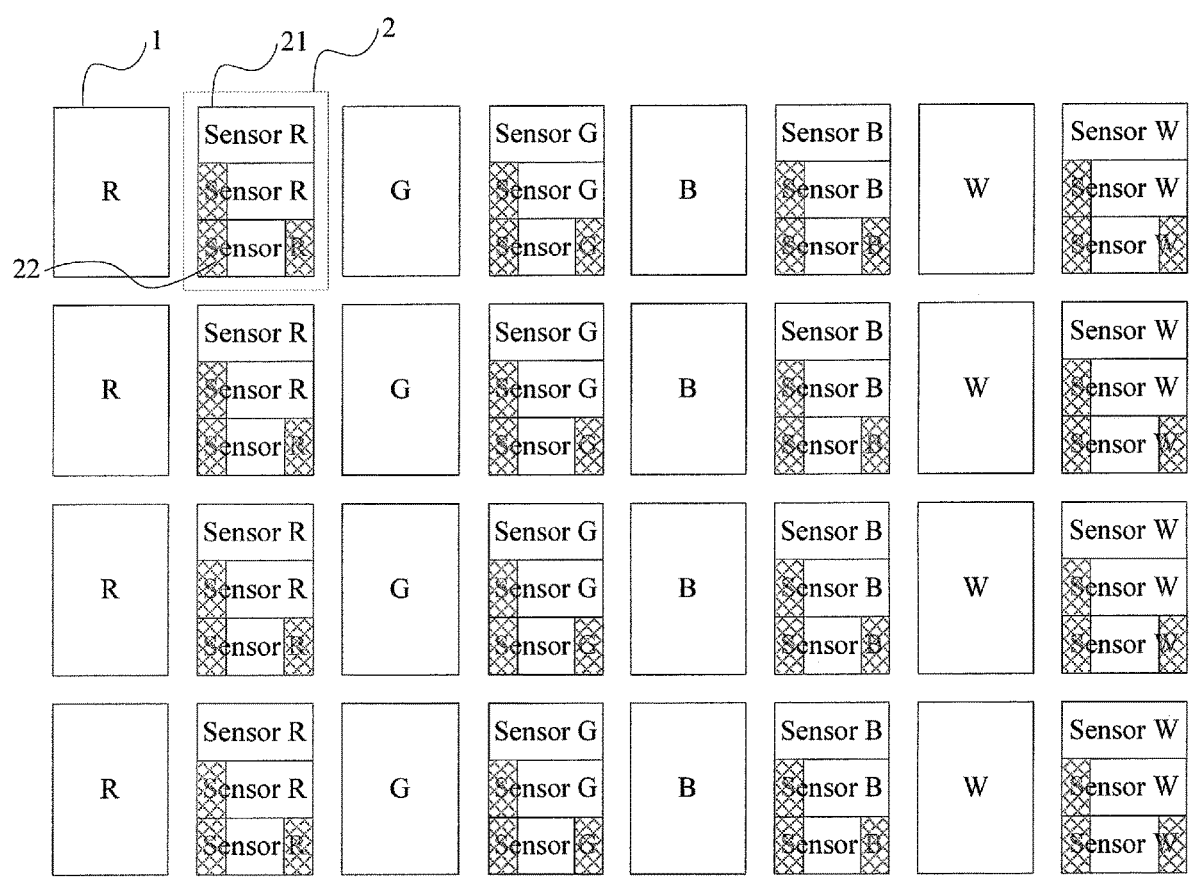
FIG. 6 is a schematic diagram of an OLED display panel according to an embodiment of the present disclosure.

In some embodiments, in the OLED display panel, as shown in FIGS. 5 and 6, in the same photosensitive detection unit 2, the light receiving area of each of the photosensitive sensors 21 is different, so that the photosensitivities of the different photosensitive sensors 21 is differentiated. As shown in FIGS. 5 and 6, the area of the non-filled region is used to represent the light receiving area.

In some embodiments, in the OLED display panel, as shown in FIG. 5, in the same photosensitive detection unit 2, the areas of the photosensitive surfaces of the photosensitive sensors 21 are different, and all the areas of the photosensitive surfaces of the photosensitive sensors 21 are light receiving areas.

In some embodiments, the photosensitive surfaces of the photosensitive sensors 21 are not shielded, as shown in FIG. 5, and all the photosensitive surfaces are used for receiving light. All the surface of each of the photosensitive sensors 21 (including filled and un-filled regions) in FIGS. 5 and 6 represents the photosensitive surface. The photosensitivity of each of the photosensitive sensors 21 can be adjusted by adjusting the area of the photosensitive surface of each of the photosensitive sensors 21. In FIG. 5, from top to bottom, the photosensitivities of the photosensitive sensors 21 in the same photosensitive detection unit 2 gradually increase, and the corresponding gray scale ranges gradually decrease.

In some embodiments, in the OLED display panel, as shown in FIG. 6, in the same photosensitive detection unit 2, the areas of the photosensitive surfaces of the photosensitive sensors 21 can be the same. In the same photosensitive detection unit 2, a shielding layer 22 is arranged on the photosensitive surface of at least one of the photosensitive sensors 21. When the shielding layer 22 is arranged on the photosensitive surfaces of at least two of the photosensitive sensors 21, each of the shielding layers 22 has a different size of opening region, and the area of the opening region serves as a light receiving area.

In some embodiments, as shown in FIG. 6, the surface area of each of the photosensitive sensors 21 is almost the same. The light receiving area of each of the photosensitive sensors 21 is adjusted by the shielding layer 22, and, accordingly, adjustment of photosensitivity of the photosensitive sensors can be realized. From top to bottom in FIG. 6, the photosensitivity of the photosensitive sensors 21 in the same photosensitive detection unit 2 gradually decreases, and the corresponding grayscale ranges gradually increase. FIG. 6 only shows that the shielding layer 22 is arranged on the photosensitive surfaces of some of the photosensitive sensors 21. In practical application, the shielding layer 22 can be arranged on the photosensitive surfaces of all the photosensitive sensors 21. It is not limited herein. Moreover, the degree and the mode of shielding the photosensitive sensors 21 in the different photosensitive detection units 2 can be set to be the same or different, which is not limited herein.

In some embodiments, in the OLED display panel, the shielding layer 22 is a metal layer or a black matrix, and is not limited herein.

Figure 8:
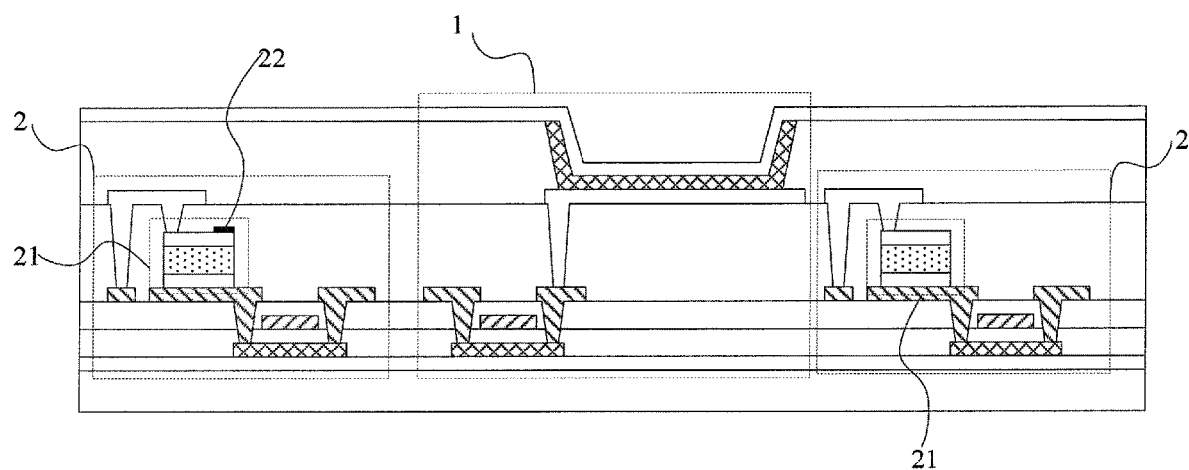
FIG. 8 is a partial schematic diagram of an OLED display panel according to an embodiment of the present disclosure.

In some embodiments, in the OLED display panel, as shown in FIG. 8, the shielding layer 22 generally contacts the photosensitive surface of the photosensitive sensor 21. That is, the shielding layer 22 is directly arranged on the surface of the photosensitive sensor 21. In actual application, according to the requirements of manufacturing process, a shielding layer 22 can also be arranged at a preset distance from the photosensitive sensor 21. It is not limited in this way. In addition, the shielding layer 22 can be realized by independently adding a film layer in the OLED display panel, or can be realized by using structure of an existing film layer. It is not limited herein. For example, as shown in FIG. 8, a shielding layer 22 is manufactured separately to achieve the shielding function.

In some embodiments, in the OLED display panel, as shown in FIGS. 5 and 6, the photosensitive detection unit 2 can be located between adjacent columns of the sub-pixel units 1. As such, when the sub-pixel units 1 are turned on line by line, and the photosensitive detection units 2 corresponding to the sub-pixel units 1 are generally located in the same row as the sub-pixel units 1. As such, the photosensitive detection units are close to the corresponding sub-pixel units respectively, and accordingly, the signals can be better received. In addition, in order to conveniently control the photosensitivities of each of the photosensitive sensors 21, the distances between each of the photosensitive sensors 21 in the same photosensitive detection unit 2 and the adjacent corresponding sub-pixel unit 1 are generally the same.

Figure 7:
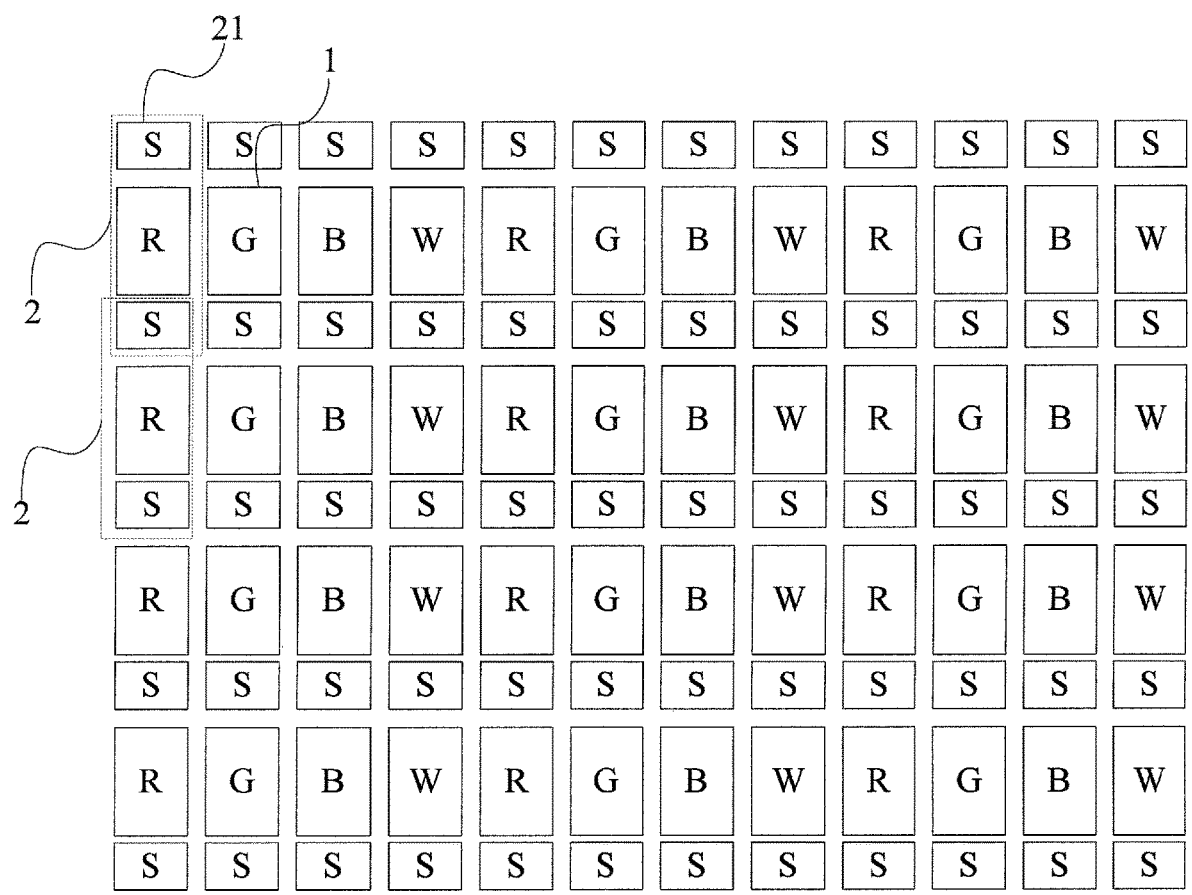
FIG. 7 is a schematic diagram of an OLED display panel according to an embodiment of the present disclosure.

In some embodiments, in the OLED display panel, as shown in FIG. 7, in the same photosensitive detection unit 2, the distances between each of the photosensitive sensors 21 and the adjacent corresponding sub-pixel unit 1 are different. As such, the photosensitivity of different photosensitive sensors 21 is differentiated. In addition, in order to conveniently control the photosensitivity of each of the photosensitive sensors 21, the light receiving areas of each of the photosensitive sensors 21 in the same photosensitive detection unit 2 are generally the same. In FIG. 7, among the photosensitive sensors 21 in the same photosensitive detection unit 2, the closer the photosensitive sensors 21 to the corresponding sub-pixel unit 1, the higher the photosensitivity is, and the lower the corresponding gray scale range is.

In some embodiments, in the OLED display panel, as shown in FIG. 7, the photosensitive detection unit 2 is located between adjacent rows of the sub-pixel units 1. As such, a plurality of photosensitive sensors 21 contained in one photosensitive detection unit 2 is located on two sides of the corresponding sub-pixel unit 1 respectively. As such, a plurality of different photosensitive detection units 2 can share some of the photosensitive sensors 21 having different distances to the sub-pixel units 1.

In some embodiments, in the OLED display panel, in the same photosensitive detection unit 2, the light receiving area of each of the photosensitive sensors 21 and the distance between the light receiving area and the corresponding sub-pixel unit 1 can be adjusted at the same time and, accordingly, both are different. It is not limited herein.

In some embodiments, in the OLED display panel, as shown in FIG. 5 and FIG. 7, the photosensitive detection units 2 can be in one-to-one correspondence with the sub-pixel units 1. That is, a photosensitive detection unit 2 is arranged beside each of the sub-pixel units 1. In some other embodiments, as shown in FIG. 4, a photosensitive detection unit 2 is in one-to-one correspondence with a pixel unit formed by sub-pixel units 1. For example, R, G, B and W can form a pixel unit.

In some embodiments, in the OLED display panel, as shown in FIG. 4 and FIG. 7, each of the photosensitive detection units 2 includes two photosensitive sensors 21 corresponding to a high grayscale range and a low grayscale range respectively. In some other embodiments, as shown in FIG. 5 and FIG. 6, each of the photosensitive detection units 2 includes three photosensitive sensors 21, which correspond to a high grayscale range, a middle grayscale range, and a low grayscale range respectively. The higher the number of photosensitive sensors 21 contained in a photosensitive detection unit 2, the higher the accuracy of the adjustment of the displayed image, but a larger area in the pixel light-emitting area is occupied by the photosensitive sensors. Therefore, the number of the photosensitive sensors 21 can be determined as needed.

In some embodiments, in the OLED display panel, the pixels contained in the sub-pixel unit 1 can have multiple implementation modes. The light emitting component can be a top-emitting type or a bottom-emitting type, which is not limited herein. The pixel having both the sensor and the OLED can be a bottom-emitting structure or a top-emitting structure. The transistors in each photosensitive detection unit 2 and the pixel can be a bottom gate type or a top gate type, which is not limited herein.

An OLED display apparatus is provided according to one embodiment of the present disclosure. The display apparatus can be a mobile phone, a tablet computer, a television, a display, a notebook computer, a digital photo frame, a navigator and other products or apparatuses having display functions. Implementation of the display apparatus can refer to the embodiments of the OLED display panel as mentioned above and is not repeated herein.

A driving method of the OLED display panel is provided according to one embodiment of the present disclosure. Since the principle of solving the problem is similar to that of the OLED display panel, implementation of the driving method can refer to the embodiments of the OLED display panel as mentioned above and is not repeated herein.

Figure 9:
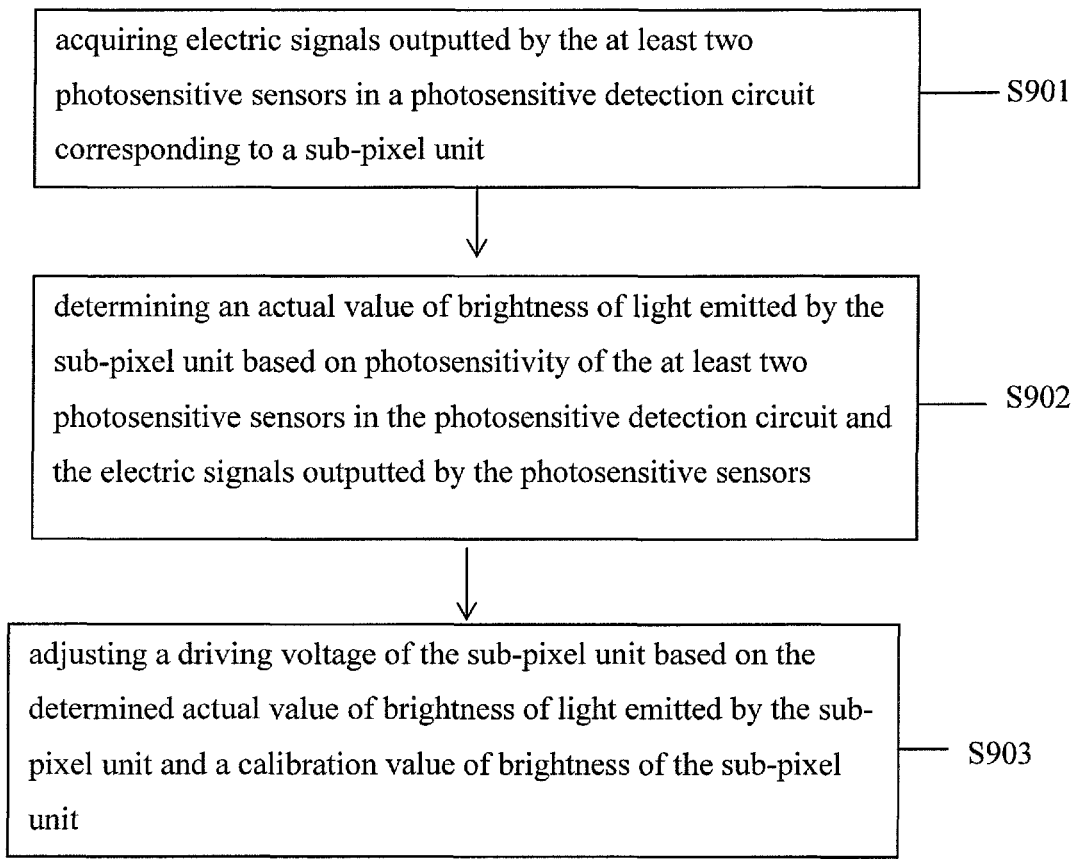
FIG. 9 is a flowchart of a driving method according to an embodiment of the present disclosure.

In some embodiments, a driving method of the OLED display panel as mentioned above is provided. As shown in FIG. 9, the method may include the following steps:

In step S901, an electric signal outputted by each of the photosensitive sensors of the photosensitive detection unit corresponding to a sub-pixel unit is acquired.

In step S902, an actual value of brightness of light emitted by the sub-pixel unit is determined according to photosensitivity of each of the photosensitive sensors in the photosensitive detection unit and the electric signal outputted by each of the photosensitive sensors.

In step S903, the driving voltage of the sub-pixel unit is adjusted based on the actual value of brightness of light emitted by the sub-pixel unit and a preset calibration value of brightness of the sub-pixel unit.

In some embodiments, electric signals outputted by the photosensitive detection unit are current signals. In some other embodiments, electric signals outputted by the photosensitive detection unit are voltage signals. It is not limited herein.

In some embodiments, in the driving method, sub-pixel units are turned on row by row during free time between displaying images. Step S901 is performed during the free time to obtain electric signals outputted by photosensitive sensors in the photosensitive detection units corresponding to a row of sub-pixel units respectively while the row of the sub-pixel units is being turned on. In some other embodiments, Step S901 is performed during the period of displaying image. It is not limited herein.

In some embodiments, in the driving method, in step S902, an actual brightness of light emitted by the sub-pixel unit is determined based in the photosensitivities of each of the photosensitive sensors in the photosensitive detection unit and the electric signals outputted by the photosensitive sensors, and step S902 specifically includes the following steps:

First, whether the electric signal outputted by each of the photosensitive sensors is an unsaturated electric signal is determined.

Then, the value of brightness corresponding to the electric signal outputted by the photosensitive sensor having the highest photosensitivity among the photosensitive sensors outputting the unsaturated electric signals is used as the actual value of brightness of light emitted by the sub-pixel unit.

In some embodiments, as shown in FIG. 4, each of the photosensitive detection units includes two photosensitive sensors S1 and S2. S1 corresponds to a low grayscale range. S2 corresponds to a high grayscale range. The photosensitive sensors S1 and S2 simultaneously read electric signals. When the image displayed is in a low gray scale, the photosensitive sensors S1 and S2 are not saturated. Accordingly, the electric signal of the photosensitive sensor S1 having the higher photosensitivity corresponding to the low gray scale is selected. When the image displayed is in a high grayscale, the photosensitive sensor S1 with the photosensitivity corresponding to the low gray scale is saturated. Accordingly, the electrical signal of the photosensitive sensor S2 with the photosensitivity corresponding to the high gray scale is selected.

In some embodiments, as shown in FIG. 5, at least one of the photosensitive detection units 2 includes three photosensitive sensors 21. In one embodiment, each of the photosensitive detection units 2 includes three photosensitive sensors 21. The photosensitive sensor 21 at the uppermost corresponds to a high grayscale range. The photosensitive sensor 21 at the bottommost corresponds to a low grayscale range. The photosensitive sensor 21 at the middle corresponds to a middle gray scale range. The three photosensitive sensors 21 simultaneously read electric signals. When the image displayed is in the low grayscale, all the three photosensitive sensors 21 are not saturated. Accordingly, the electric signal of the bottommost photosensitive sensor 21 with the highest photosensitivity corresponding to the low grayscale range is selected. When the image displayed is in the middle grayscale range, the photosensitive sensor 21 with the highest photosensitivity corresponding to the low grayscale range is saturated. The electric signal of the photosensitive sensor 21 with the proper photosensitivity corresponding to the middle grayscale range is selected. When the image displayed is in a high grayscale range, the photosensitive sensors 21 with relatively large photosensitivity corresponding to the low gray scale range and the middle gray scale range are saturated. Accordingly, the electrical signal of the photosensitive sensor 21 with the lowest photosensitivity corresponding to the high gray scale range is selected.

In some embodiments, in the driving method, in step S903, the driving voltage of the sub-pixel unit is adjusted based on the actual value of brightness of the light emitted by the sub-pixel unit and the preset calibration value of brightness of the sub-pixel unit, and Step S903 may include the following steps:

When it is determined that the actual value of brightness of light emitted by the sub-pixel unit is larger than the preset calibration value of brightness, the driving voltage of the sub-pixel units is adjusted lower.

When it is determined that the actual value of brightness of light emitted by the sub-pixel unit is smaller than the preset calibration value of brightness, the driving voltage of the sub-pixel units is adjusted higher.

When it is determined that the actual value of brightness of light emitted by the sub-pixel unit is equal to the preset calibration value of brightness, the driving voltage of the sub-pixel unit is maintained.

The OLED display panel, the driving method of the OLED display panel, and the display apparatus are provided according to the embodiments of the present disclosure. At least two photosensitive sensors are arranged in the photosensitive detection unit of the corresponding sub-pixel unit. The photosensitivities of the at least two photosensitive sensors in the same photosensitive detection unit are different from each other. Different photosensitivities refer to different degrees of intensity of light received within a unit of time by the photosensitive sensor. The photosensitive sensors with different photosensitivities correspond to different grayscale ranges respectively. The lower the grayscale range the photosensitive sensor corresponds to, the higher photosensitivity the photosensitivity sensor has. Therefore, under the same condition, the electric signals outputted by the photosensitive sensors corresponding to the lower gray scale range are saturated first. The electric signals outputted by the photosensitive sensors corresponding to the higher grayscale range are less easily saturated. As such, when the brightness of the sub-pixel unit is detected, the actual value of brightness of light emitted by the sub-pixel unit can be determined based on the photosensitivity of each of the photosensitive sensors in the photosensitive detection unit and the electric signals outputted by the photosensitive sensors. Then, the driving voltage of the sub-pixel unit is adjusted based on the determined actual value of brightness of light emitted by the sub-pixel unit and a preset calibration value of brightness. As such, the brightness of the photosensitive sensors with different photosensitivities is distinguished for different grayscale ranges, and the accuracy of adjustment of the display image by the photosensitive sensors is guaranteed.

For the above method embodiments, for simplicity of description, all the actions are expressed as a series of combinations of actions. However, one of ordinary skill in the art should know that the method is not limited to the sequence of the actions as described. According to the disclosure, some steps can be carried out in other orders or simultaneously. Secondly, those skilled in the art will also know that the embodiments described in the specification are just some of the embodiments. The action and the circuit involved in the disclosure are not necessarily as required by the disclosure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display panel comprising:
    a plurality of sub-pixel units; and
    a plurality of photosensitive detection units corresponding to the plurality of sub-pixel units respectively;
    wherein one of the plurality of the photosensitive detection units comprises at least two photosensitive sensors;
    photosensitivity of each of the at least two photosensitive sensors in a same photosensitive detection unit is different from one another;
    the at least two photosensitive sensors in the same photosensitive detection unit is configured to determine brightness of light emitted by a sub-pixel unit based on photosensitivity of the at least two photosensitive sensors.

2. The display panel according to claim 1, wherein a light receiving area of each of the at least two photosensitive sensors in the same photosensitive detection unit is different from one another.

3. The display panel according to claim 2, wherein an area of a photosensitive surface of each of the at least two photosensitive sensors in the same photosensitive detection unit is different from one another, and the area of the photosensitive surface is the light receiving area.

4. The display panel according to claim 2, wherein an area of a photosensitive surface of each of the at least two photosensitive sensors in the same photosensitive detection unit is the same, and at least one of photosensitive surfaces of the at least two photosensitive sensors in the same photosensitive detection unit is provided with a shielding layer.

5. The display panel according to claim 4, wherein at least two of the photosensitive surfaces of the at least two photosensitive sensors in the same photosensitive detection unit are provided with shielding layers respectively, each of the shielding layers has an opening region of a different size, and an area of the opening region is the light receiving area.

6. The display panel according to claim 5, wherein each of the shielding layers is a metal layer or a black matrix.

7. The display panel according to claim 5, wherein the shielding layers and the photosensitive surfaces of the photosensitive sensors are in contact with each other.

8. The display panel according to claim 1, wherein the plurality of photosensitive detection units is located between adjacent columns of the sub-pixel units.

9. The display panel according to claim 8, wherein distances between each of the photosensitive sensors in the same photosensitive detection unit and an adjacent sub-pixel unit corresponding to the photosensitive detection unit are different.

10. The display panel according to claim 1, wherein the photosensitive detection units are located between adjacent rows of the sub-pixel units.

11. The display panel according to claim 10, wherein the at least two photosensitive sensors in a photosensitive detection unit are located on two sides of a sub-pixel unit corresponding to the photosensitive detection unit respectively.

12. The display panel according to claim 11, wherein two adjacent photosensitive detection units in a same column share some of the at least two photosensitive sensors.

13. The display panel according to claim 1, wherein the photosensitive detection units are in one-to-one correspondence with the sub-pixel units.

14. The display panel according to claim 1, wherein one of the plurality of the photosensitive detection units comprises three photosensitive sensors.

15. A display apparatus comprising the display panel according to claim 1.

16. A driving method of a display panel, wherein the display panel comprises:
    a plurality of sub-pixel units; and
    a plurality of photosensitive detection units corresponding to the plurality of sub-pixel units respectively;
    wherein one of the plurality of the photosensitive detection units comprises at least two photosensitive sensors; and
    the driving method comprises:
        acquiring electric signals outputted by the at least two photosensitive sensors in a photosensitive detection unit corresponding to a sub-pixel unit;
        determining an actual value of brightness of light emitted by the sub-pixel unit based on photosensitivity of the at least two photosensitive sensors in the photosensitive detection unit and the electric signals outputted by the photosensitive sensors; and
        adjusting a driving voltage of the sub-pixel unit based on the determined actual value of brightness of light emitted by the sub-pixel unit and a calibration value of brightness of the sub-pixel unit.

17. The driving method according to claim 16, wherein determining the actual value of brightness of light emitted by the sub-pixel unit based on photosensitivity of the at least two photosensitive sensors in the photosensitive detection unit and the electric signals outputted by the photosensitive sensors comprises:
    determining the photosensitive sensors outputting unsaturated electric signals; and
    determining the actual value of brightness of light emitted by the sub-pixel unit based on an electric signal of a photosensitive sensor with the highest photosensitivity among the photosensitive sensors outputting the unsaturated electric signals.

18. The driving method according to claim 16, wherein adjusting the driving voltage of the sub-pixel unit based on the determined actual value of brightness of light emitted by the sub-pixel unit and the calibration value of brightness of the sub-pixel unit comprises:

adjusting the driving voltage of the sub-pixel unit lower if the actual value of brightness of light emitted by the sub-pixel unit is larger than the calibration value of brightness;

adjusting the driving voltage of the sub-pixel unit higher if the actual value of brightness of light emitted by the sub-pixel unit is smaller than the calibration value of brightness; and maintaining the driving voltage of the sub-pixel unit if the actual value of brightness of light emitted by the sub-pixel unit is equal to the calibration value of brightness.

\* \* \* \* \*